(12) United States Patent
Yoshida (10) Patent No.: US 9,222,017 B2
(45) Date of Patent: Dec. 29, 2015

(54) METHOD OF MANUFACTURING FLUORIDE PHOSPHOR

(71) Applicant: NICHIA CORPORATION, Anan-shi (JP)

(72) Inventor: Tomokazu Yoshida, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/804,337

(22) Filed: Jul. 21, 2015

(65) Prior Publication Data

US 2015/0322338 A1    Nov. 12, 2015

Related U.S. Application Data

(62) Division of application No. 14/322,872, filed on Jul. 2, 2014, now Pat. No. 9,120,972.

(30) Foreign Application Priority Data

Jul. 3, 2013 (JP) .................................. 2013-140212
Jun. 13, 2014 (JP) ................................. 2014-122887

(51) Int. Cl.
*C09K 11/61* (2006.01)
*H01L 33/50* (2010.01)
(Continued)

(52) U.S. Cl.
CPC .............. *C09K 11/617* (2013.01); *C09K 11/025* (2013.01); *C09K 11/675* (2013.01); *H01L 33/06* (2013.01); *H01L 33/502* (2013.01); *G02F 1/133603* (2013.01); *H01L 33/54* (2013.01)

(58) Field of Classification Search
CPC .. C09K 11/617; C09K 11/675; C09K 11/025; H01L 33/502; H01L 33/54; H01L 33/06; G02F 1/133603

USPC ................ 313/485, 503, 512; 438/28, 29, 34; 257/40, 79, 89, 98, E33.001, E33.025, 257/E33.055, E33.06, E51.001, E51.047; 252/301.4; 349/70

See application file for complete search history.

(56) References Cited

U.S. PATENT DOCUMENTS 8,057,706 B1    11/2011   Setlur et al.
8,237,154 B2 *   8/2012   Jang ..................... C09K 11/025
                                                          257/103
(Continued)

FOREIGN PATENT DOCUMENTS

JP    2009-528429    8/2009
JP    2010-209311    9/2010
(Continued)

OTHER PUBLICATIONS

A.G. Paulusz, "Efficient Mn(IV) Emission in Fluorine Coordination", J. Electrochemical Soc., vol. 120 No. 7, Jul. 1973, p. 942-947.
(Continued)

*Primary Examiner* — Dao H Nguyen
(74) *Attorney, Agent, or Firm* — Mori & Ward, LLP (57) ABSTRACT

A method of manufacturing a fluoride phosphor includes mixing a first solution which contains at least Mn and F, a second solution which contains at least K and F, and a third solution which contains at least Si and F to form phosphor cores whose composition is represented by a formula $K_2[M_{1-a}Mn^{4+}{}_aF_6]$ wherein a satisfies $0<a<0.2$, and M includes at least one selected from group-IV elements of Ti, Zr, and Hf and group IVB elements of Si, Ge, Sn. The phosphor cores and a fourth solution containing a reducing agent are mixed to form a surface region on each of the phosphor cores so that a concentration of tetravalent Mn on the surface region of one of the phosphor cores is lower than in an inner region of the one of the phosphor cores.

15 Claims, 3 Drawing Sheets

(51) Int. Cl.
  *H01L 33/00* (2010.01)
  *H01L 33/06* (2010.01)
  *C09K 11/67* (2006.01)
  *C09K 11/02* (2006.01)
  *H01L 33/54* (2010.01)
  *G02F 1/1335* (2006.01)

(56) References Cited

U.S. PATENT DOCUMENTS

| | | | |
|---|---|---|---|
| 2007/0103057 A1* | 5/2007 | Sohn | C09K 11/7792 313/503 |
| 2008/0061674 A1* | 3/2008 | Chen | C09K 11/643 313/485 |
| 2010/0142189 A1 | 6/2010 | Hong et al. | |
| 2011/0304261 A1 | 12/2011 | Winkler et al. | |
| 2014/0175492 A1 | 6/2014 | Steranka et al. | |
| 2015/0035430 A1* | 2/2015 | Yoshida | C09K 11/616 313/503 |
| 2015/0048399 A1 | 2/2015 | Weiler et al. | |
| 2015/0054011 A1* | 2/2015 | Koizumi | H01L 33/505 257/98 |
| 2015/0054400 A1 | 2/2015 | Murphy | |
| 2015/0055060 A1* | 2/2015 | Yoshida | H05B 33/14 349/70 |
| 2015/0228869 A1* | 8/2015 | Yoo | H01L 33/54 362/97.3 |

FOREIGN PATENT DOCUMENTS

| | | |
|---|---|---|
| JP | 2011-012091 | 1/2011 |
| JP | 2014-177586 | 9/2014 |
| WO | WO 2007/100824 | 9/2007 |
| WO | WO 2012/128837 | 9/2012 |

OTHER PUBLICATIONS

Japanese Office Action for corresponding JP Application No. 2014-122887, Apr. 21, 2015.

* cited by examiner

METHOD OF MANUFACTURING FLUORIDE PHOSPHOR

CROSS-REFERENCE TO RELATED APPLICATIONS

The present application is a divisional application of the U.S. patent application Ser. No. 14/322,872 filed Jul. 2, 2014, which claims priority under 35 U. S. C. §119 to Japanese Patent Application No. 2013-140212, filed Jul. 3, 2013 and Japanese Patent Application No. 2014-122887, filed Jun. 13, 2014. The contents of these applications are incorporated herein by reference in their entirety.

BACKGROUND OF THE INVENTION

1. Technical Field

The present disclosure relates to a method of manufacturing a fluoride phosphor.

2. Background Art

A light emitting diode (LED) is a light emitting device which is frequently used as a substitute for conventional light sources such as an incandescent bulb. Such a light emitting diode is useful as a backlight of display device, a warning lamp, an indicating lamp, and for luminarie. Also various light emitting devices which employ a laser diode (LD) are proposed, in those, in a similar manner as in such a light emitting diode, a laser diode is used in combination with a phosphor. The light emitting diodes and laser diodes are both semiconductor light emitting elements fabricated using an alloy of group III-V compound such as gallium nitride (GaN). Combining such a semiconductor light emitting element and a phosphor, various light emitting devices to emit light of a white color, an incandescent lamp color, or an orange color have been developed. Those light emitting devices to emit a white light etc., can be obtained based on the principle of light-color mixing. As for the system to emit a white light, there are well-known systems such as a system which employs an ultraviolet-light emitting element and three types of phosphors which emit lights of RGB colors respectively, and a system which employs a blue-light emitting element and a yellow-light emitting phosphor. Light emitting devices of the type which employ a blue-light emitting element and a yellow phosphor etc., are in demand in a wide range of fields such as luminaries, e.g., a fluorescent-type lamp, an on-vehicle luminaire, a display, a backlight for liquid crystal. Of those, for the phosphors used for a backlight of liquid crystal, in order to reproduce a wide range of colors on a chromaticity diagram, high color purity is also demanded along with the light emitting efficiency. Particularly, the phosphors used for backlights for liquid crystal are required to have compatibility in combination with a filter, and a phosphor with a narrow half width of the emission peak has been in demand.

For example, as for red phosphors which have an excitation band in blue-color region and a narrow half width of the emission peak, fluoride phosphors having compositions such as $K_2TiF_6:Mn^{4+}$, $Ba_2TiF_6:Mn^{4+}$, $Na_2TiF_6:Mn^{4+}$, and $K_3ZrF_7:Mn^{4+}$ etc., are known (for example, see JP 2009-528429A).

As for another phosphor, fluoride phosphor $K_2SiF_6:Mn^{4+}$ is also known (for example, see JP 2010-209311A).

As for a yet another phosphor, excitation/emission spectra and mechanism of emission of a fluoride complex phosphor activated with $Mn^{4+}$ is also known (for example, see A. G. Paulusz, *Effective Mn (IV) Emission in Fluoride Coordination*; J. Electrochemical Soc., 120 N7, 1973, p942-947).

Such a fluoride phosphor which is activated with tetravalent Mn and can emit red light with a narrow half width of the emission peak, and a light emitting device using the same are assumed to be particularly suitable for the use as a backlight in a liquid crystal device. Thus, practical use of those has been demanded. On the other hand, conventional fluoride phosphors activated with tetravalent Mn have poor resistance to water. That is, Me which are tetravalent Mn present on the surface of the phosphor particles are exposed to the moisture in the air and oxidized to manganese dioxide ($MnO_2$) which has a dark color, which is thought to resulting in degradation of the luminance. Accordingly, satisfactory durability cannot be obtained in a long-term reliability test, so that the usage which requires reliability, for example, for LCD backlight applications and in-vehicle applications, has been regarded difficult to implement.

SUMMARY

According to one aspect of the present invention, a method of manufacturing a fluoride phosphor includes mixing a first solution which contains at least Mn and F, a second solution which contains at least K and F, and a third solution which contains at least Si and F to form phosphor cores whose composition is represented by a formula $K_2[M_{1-a}Mn^{4+}{}_aF_6]$ wherein a satisfies 0<a<0.2, and M includes at least one selected from group-IV elements of Ti, Zr, and Hf and group IVB elements of Si, Ge, Sn. The phosphor cores and a fourth solution containing a reducing agent are mixed to form a surface region on each of the phosphor cores so that a concentration of tetravalent Mn on the surface region of one of the phosphor cores is lower than in an inner region of the one of the phosphor cores.

According to another aspect of the present invention, a method of manufacturing a fluoride phosphor includes mixing a first solution which contains at least Mn and F, a second solution which contains at least K and F, and a third solution which contains at least Si and F to form phosphor cores whose composition is represented by a formula $K_2[M_{1-a}Mn^{4+}{}_aF_6]$ wherein a satisfies 0<a<0.2, and M includes at least one selected from group-IV elements of Ti, Zr, and Hf and group IVB elements of Si, Ge, Sn. The phosphor cores are introduced into the third solution. The third solution including the phosphor cores, a fourth solution containing a reducing agent, and the second solution which does not substantially contain tetravalent Mn are mixed to form a surface region on each of the phosphor cores such that a concentration of tetravalent Mn in the surface region of one of the phosphor cores is 0.5% or more and 30% or less with respect to a concentration of tetravalent Mn in an inner region of the one of the phosphor cores.

According to further aspect of the present invention, a method of manufacturing a fluoride phosphor includes mixing a first solution which contains at least Mn and F, a second solution which contains at least K and F, and a third solution which contains at least Si and F to form phosphor cores whose composition is represented by a formula $K_2[M_{1-a}Mn^{4+}{}_aF_6]$ wherein a satisfies 0<a<0.2, and M includes at least one selected from group-IV elements of Ti, Zr, and Hf and group IVB elements of Si, Ge, Sn. The phosphor cores and a fourth solution containing a reducing agent are mixed.

DETAILED DESCRIPTION OF EMBODIMENTS

The embodiments of the present invention will be described below with reference to the drawings. The embodiments are intended as illustrative of a phosphor and a light emitting device using the same, and a method of manufacturing the phosphor to give a concrete form to technical ideas of the present disclosure, and the scope of the invention is not limited to those described below.

In the specification, the relation between the color names and the chromaticity coordinates, the relation between the range of wavelength of light and the color name of single color light, and the like, conform to JIS Z8110. More specifically, 380 nm to 455 nm correspond to blue purple light, 455 nm to 485 nm correspond to blue light, 485 nm to 495 nm correspond to blue green light, 495 nm to 548 nm correspond to green light, 548 nm to 573 nm correspond to yellow green light, 584 nm to 610 nm correspond to yellow red light, and 610 nm to 780 nm correspond to red light. In the specification, light in short-wavelength region of visible light is not specifically limited, but may be indicated to a 400 nm to 500 nm region.

As explained above, a conventional fluoride phosphor activated with tetravalent Mn have a drawback of poor water resistance. The inventor suspects the reason of such problem as $Mn^{4+}$ which are tetravalent Mn present on the surface of the phosphor particles are exposed to the water (moisture) in the air then oxidized to manganese dioxide ($MnO_2$) which shows a dark color, resulting in degradation of the luminance.

To solve this problem, a fluoride phosphor according to the embodiment of the present invention has been developed, which is represented by the general formula shown below, and its particle forms a surface region where the concentration of tetravalent Mn is lower than its inner region.

In particular, a fluoride phosphor according to an aspect of the disclosure is activated with tetravalent Mn and can absorb blue light and emit red light. The phosphor is represented by the general formula shown below, and the phosphor particles respectively have a surface region where the concentration of tetravalent Mn is lower than the inner region.

$K_2[M_{1-a}Mn^{4+}{}_aF_6]$ (where M is at least one selected from group-IV elements of Ti, Zr, and Hf and group IVB elements of Si, Ge, Sn, and a is 0<a<0.2).

The phosphor particles according to an embodiment are preferably arranged so that the concentration of tetravalent Mn is approximately uniform in the inner region of the phosphor particles, and is gradually decreased toward the surface in the surface region. With this arrangement, while maintaining the characteristics of broad color reproduction range with the main portion of the phosphor which is a fluoride phosphor activated with tetravalent Mn, the existence probability of tetravalent Mn at the surfaces of the particles are reduced, so that even in the case of surface elution due to humidity or the like, generation of $MnO_2$ can be suppressed which further suppressing blackening. Thus, degradation in the emission intensity can be reduced.

Further, the concentration of tetravalent Mn in the surface region is preferably 30% or less with respect to the concentration of tetravalent Mn in the inner region.

Further, the fluoride phosphor is preferably prepared so that an elution amount of tetravalent Mn obtained by charging the fluoride phosphor in 1 to 5 times amount of pure water relative to the amount of the phosphor to dissolve surface of the phosphor particles is in a range of 0.05 to 3 ppm.

Moreover, the fluoride phosphor is preferably prepared so that a luminous flux maintaining rate obtained by charging the fluoride phosphor in 1 to 5 times amount of pure water relative to the amount of the phosphor is 90% or greater.

In the general formula described above, M is preferably Si or Si and Ge.

Further, a light emitting device which includes a light source to emit a short-wavelength visible light and the fluoride phosphor to absorb the light and emit a red light can be obtained. As described above, employing a fluoride phosphor activated with tetravalent Mn allow for obtaining of a light emitting device which has a wider color reproduction range and excellent light emission characteristics than light emitting devices with conventional fluoride phosphors.

EMBODIMENTS

In reliability tests of fluoride phosphors under humid conditions, tetravalent Mn serves as an activator and are located on the surface of the phosphor particles react with water to create $MnO_2$ which has a dark color, resulting in degradation of the luminance. As a result of intensive studies on the surface composition of fluoride phosphors, the present inventor found that forming a surface region with lower tetravalent Mn on the phosphor particles while maintaining the same composition as a phosphor allows for an improvement in the water resistance of the phosphor.

The fluoride phosphor according to the present embodiment can be represented by a general formula $K_2[M_{1-a}Mn^{4+}{}_aF_6]$ (wherein M is at least one selected from group-IV elements of Ti, Zr, and Hf and group IVB elements of Si, Ge, Sn, and a is 0<a<0.2). The fluoride phosphor is activated with tetravalent Mn. The particles of the fluoride phosphor have a surface region having the same composition as that of the inner region except for a smaller amount of tetravalent Mn. With this arrangement, fluoride phosphors which can be excited by a short-wavelength visible light to emit light of red region and has excellent water resistance can be realized. Also, a fluoride phosphor having an emission spectrum with a narrow half width of the emission peak can be realized.

Surface Region

Figure 1:
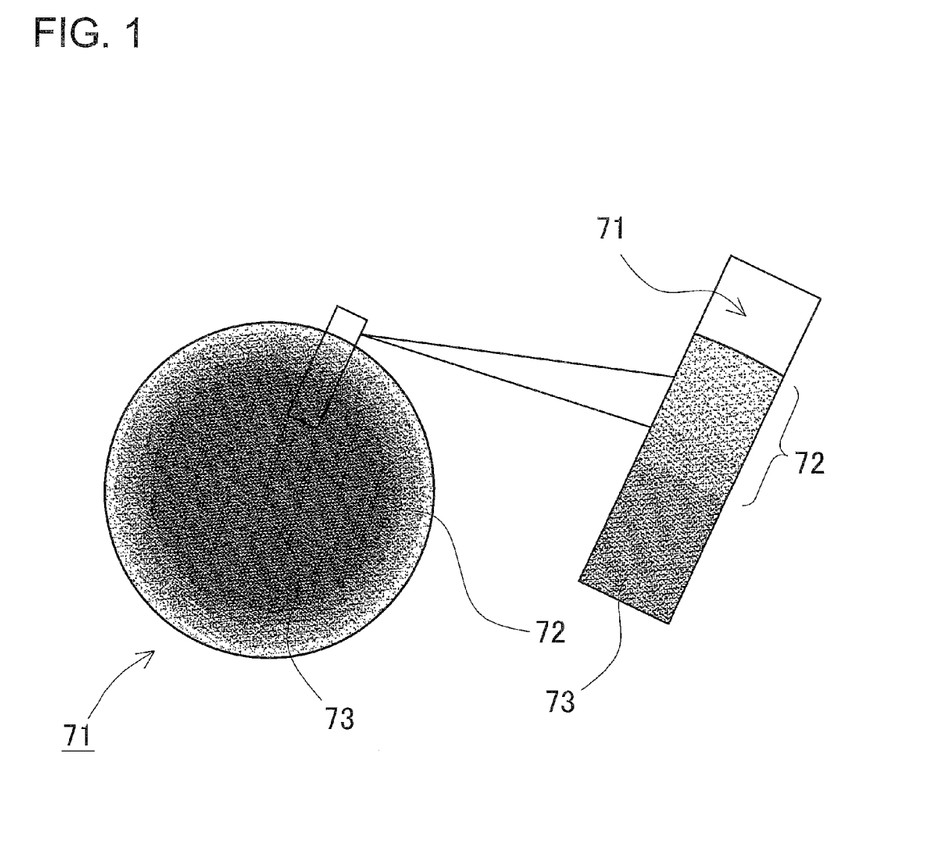
FIG. 1 is a schematic cross-sectional view approximately showing the concentration distribution of $Mn^{4+}$ in a phosphor particle.

The surface region described above includes a low tetravalent Mn concentration region where the concentration of tetravalent Mn is lower than that in the inner region. The surface region is not demarcated clearly by, for example, a two-layered structure, from the inner region, but as shown in FIG. 1 where the tetravalent Mn are shown by dots, the surface region is formed on the phosphor particles 71 with gradually decreasing concentration toward the surface. The change in the concentration of tetravalent Mn is not limited to the state in which the concentration is decreased rather constantly from the phosphor core that is the inner region 73 in FIG. 1. But as shown in FIG. 1, the concentration of tetravalent Mn is preferably approximately uniform in the inner region 73 of the phosphor particles 71, while in the surface region 72 which corresponds to the surface portion of the phosphor particles 71, the concentration of tetravalent Mn decreases toward the surface. With this arrangement, while maintaining the characteristics of broad color reproduction range compared to that of conventional fluoride phosphors, with the main portion of the phosphor which is a fluoride phosphor activated with tetravalent Mn, even in the case where the surfaces of the phosphor particles 71 are eluded due to humidity, with the lack of tetravalent Mn on the surface, the generation of $MnO_2$ can be suppressed which further suppressing blackening. Thus, degradation in the emission intensity can be reduced. It should be noted that the surface region 72 shown in FIG. 1 is in an ideal state. The surface region 72 is not necessarily formed to completely cover the entire inner region 73 of the phosphor particles 71, and such a state is also included in the embodiment of the present invention. That is, a state of the phosphor particles 71 having a part of the inner region 73 exposed on the surface region 72 to a degree that can maintain sufficient resistance to moisture is also included in the embodiment of the present invention.

The concentration of tetravalent Mn in the surface region is preferably 30% or less with respect to the tetravalent Mn in the inner region of the phosphor. Further, the concentration of tetravalent Mn in the surface region is preferably 25% or less, more preferably 20% or less, with respect to that in the inner region. Meanwhile, the concentration of tetravalent Mn in the surface region can be 0.5% or more with respect to that of the inner region. As described above, the concentration of tetravalent Mn is ideally approximately zero, but an increase in the surface region with a low tetravalent Mn increases the region which does not contribute to emission on the surface of the phosphor particles, which would lead a decrease of the emission intensity.

Although depending on the particle diameter of the phosphor, the thickness of the surface region is preferably about 1/20 to about 1/50 with respect to the average particle diameter. For example, in the case where the phosphor particles have an average particle diameter of 30 to 50 lm and a median particle diameter of 40 to 60 lm, the thickness of the surface region may be 1 lm or less.

Further, the fluoride phosphor is preferably prepared so that an elution amount of tetravalent Mn obtained by charging the fluoride phosphor in 1 to 5 times amount of pure water relative to the amount of the phosphor to dissolve surface of the phosphor particles is in a range of 0.05 to 3 ppm. The elution amount of tetravalent Mn is preferably in a range of 0.1 to 2.5 ppm and more preferably in a range of 0.2 to 2.0 ppm. This is because, although the lower the elution amount of tetravalent Mn the higher the water resistance will be, the greater the ratio of surface area with a low concentration of tetravalent Mn will result in a greater degradation of emission intensity.

Such an arrangement described above allows for suppressing the degradation of emission luminance due to coloration caused by $MnO_2$ attributable to $Mn^{4+}$ eluded in the water, and thus a fluoride phosphor with high water resistance can be realized. In the general formula described above, M is preferably Si or Si and Ge. With this arrangement, a fluoride phosphor with high optical intensity can be provided.

Method of Manufacturing Fluoride Phosphor
(1) Mixing a solution which contains at least Mn and F, a solution which contains at least K and F, and a solution which contains at least Si and F to form a precipitate (phosphor)

In the specification, the term "a solution which contains at least Mn and F (hereinafter may be called as "a solution A")" refers to a solution of hydrofluoric acid which contains a Mn source. Examples of Mn source in the solution A include $K_2MnF_6$, $KMnO_4$, and $K_2MnCl_6$. Among those, $K_2MnF_6$ is preferable, because $K_2MnF_6$ does not contain Cl which causes distortions in crystal lattice which may result in instability of the crystal, so that while maintaining its oxidation number (tetravalent) which can serve as an activator, allowing for stable presence in the hydrofluoric acid as $MnF_6$ complex ions. Of the Mn sources, a source which contains K also serves as a K source.

In the specification, the term "a solution which contains at least K and F (hereinafter may be called as "a solution B")" refers to a solution of hydrofluoric acid which contains a K source. Examples of K source in the solution B include water-soluble potassium salts such as KF, $KHF_2$, KOH, KCl, KBr, KI, potassium acetate ($CH_3COOK$), and $K_2CO_3$. Among those, $KHF_2$ is preferable, because $KHF_2$ is soluble without decreasing the concentration of hydrogen fluoride in the solution, and has a small heat of dissolution which contributes high safety.

Those Mn sources and K sources may be used singly or in combination of two or more kinds.

In the specification, the term "a solution which contains at least Si and F (hereinafter may be called as "a solution C")" refers to an aqueous solution which contains a $SiF_6$ source. The $SiF_6$ source contained in the solution C is a compound which contains Si and F with good solubility to the solution. Examples thereof include $H_2SiF_6$, $Na_2SiF_6$, $(NH_4)_2SiF_6$, $Rb_2SiF_6$, and $Cs_2SiF_6$. Among those, $H_2SiF_6$ is preferable, because $H_2SiF_6$ has high solubility to water and does not contain an alkali metal element as inevitable impurities. Those $SiF_6$ sources may be used singly or in combination of two or more kinds.

The concentration of hydrogen fluoride in the solution A is typically 30 weight % or greater, preferably 35 weight % or greater, more preferably 40 weight % or greater, and typically 70 weight % or less, preferably 65 weight % or less, more preferably 60 weight % or less. In the case where the concentration of hydrogen fluoride is too low, $K_2MnF_6$ which is the raw material of activator element and contained in the solution A is unstable and easily hydrolyzed, which may cause abrupt change in the Mn concentration. Thus, control of amount of Mn as the activator in the synthesized phosphor becomes difficult, which tends to widen the variation in luminous efficiency of the phosphor. On the other hand, in the case where the concentration of hydrogen fluoride is too high, the boiling point decreases and generation of hydrogen fluoride gas tends to take place. Thus, control of concentration of hydrogen fluoride in the solution becomes difficult, which tends to widen the variation in the particle size of the phosphor.

The concentration of K source in the solution B is typically 20 weight % or greater, preferably 25 weight % or greater, more preferably 30 weight % or greater, and typically 70 weight % or less, preferably 65 weight % or less, more preferably 55 weight % or less. In the case where the concentration of K is too low, the yield of the phosphor tends to decrease. In the case where the concentration of K is too high, the particle size of the phosphor tends to be too small.

The mixing method of the solutions A to C is not specifically limited, and the mixing may be performed by adding the solutions B and C into the solution A while stirring the solution A, or by adding the solutions A and B into the solution C while stirring the solution C. Alternatively, all the solutions A to C may be charged at once and stirring and mixing is performed.

Mixing of the solutions A to C allows reaction of the Mn-source, the K-source, and the $SiF_6$-source to precipitate desired phosphor crystals. The crystals are collected by using a solid-liquid separation technique, such as filtering, and washed with a suitable solution such as ethanol, water, acetone. The filtered crystals are then tried at a temperature generally 50° C., preferably 55° C. or greater, and generally 110° C. or less, preferably 100° C. or less, more preferably 90° C. or less. The drying time is not specifically limited as long as the moisture adhered to the phosphor can be evaporated, and for example, drying may be performed for about 10 hours.

At the time of mixing of the solutions A to C, considering a difference between the charge composition of raw materials of the phosphor and the composition of the phosphor product, the mixing ratio of the solutions A to C is needed to be adjusted so that the phosphor product has a desired composition.

(2) Mixing the phosphor product (phosphor core) obtained above, a solution which contains at least Si and F (hereinafter may be referred to as a "solution D"), a solution which contains a reducing agent, and a solution which contains at least K and F (hereinafter may be referred to as a "solution E", to form a surface region on the surfaces of phosphor particles so that the surface region has a concentration of tetravalent Mn lower than that of inner side of the phosphor particles.

In the specification, the term "a solution which contains at least Si and F (hereinafter may be called as "a solution D")" refers to an aqueous solution which contains a $SiF_6$ source.

The $SiF_6$ source contained in the solution D is a compound which contains Si and F with good solubility to the solution. Examples thereof include $H_2SiF_6$, $Na_2SiF_6$, $(NH_4)_2SiF_6$, $Rb_2SiF_6$, and $Cs_2SiF_6$. Among those, $H_2SiF_6$ is preferable, because $H_2SiF_6$ has high solubility to water and does not contain an alkali metal element as inevitable impurities. Those $SiF_6$ sources may be used singly or in combination of two or more kinds.

The concentration of hydrogen fluoride in the solution D is typically 25 weight % or greater, preferably 30 weight % or greater, more preferably 35 weight % or greater, and typically 65 weight % or less, preferably 60 weight % or less, more preferably 55 weight % or less. The concentration of $SiF_6$-source in the solution D is typically 3 weight % or greater, preferably 5 weight % or greater, and typically 40 weight % or less and preferably 30 weight % or less.

For the solution which contains a reducing agent, a solution which contains hydrogen peroxide or oxalic acid can be used. Of those, hydrogen peroxide is preferable, because hydrogen peroxide allows reduction of Mn without affecting the base particles of the phosphor and to be eventually decomposed into harmless oxygen and hydrogen, which facilitates the use in manufacturing and has a low environmental burden.

In the specification, the term "a solution which contains at least K and F (hereinafter may be called as "a solution E")" refers to a solution of hydrofluoric acid which contains a K-source. Examples of K-source in the solution E include water-soluble potassium salts such as KF, $KHF_2$, KOH, KCl, KBr, Kl, potassium acetate ($CH_3COOK$), and $K_2CO_3$. Among those, $KHF_2$ is preferable, because $KHF_2$ is soluble without decreasing the concentration of hydrogen fluoride in the solution, and has a small heat of dissolution which contributes high safety.

Mixing of the solutions D and E may be carried out by stirring the solution D which contains Si and F and to which a phosphor (phosphor core) has been added, a solution which contains a reducing agent and the solution E are added in this order.

The products are collected by using a solid-liquid separation technique, such as filtering, and washed with a suitable solution such as ethanol, water, acetone. The filtered crystals are then tried at a temperature generally 50° C., preferably 55° C. or greater, more preferably 60° C. or greater, and generally 110° C. or less, preferably 90° C. or less. The drying time is not specifically limited as long as the moisture adhered to the phosphor can be evaporated, and for example, drying may be performed for about 10 hours.

Light Emitting Device

Further, a light emitting device can be fabricated with the use of the fluoride phosphor in combination with a light source which can emit a short-wavelength visible light. For example, a white light emitting device has been developed with employing a combination of a blue light emitting LED and a phosphor which can be excited by the blue light to emit yellow light, but such a light emitting device tends to have insufficient red color component. Thus, with a combination of the fluoride phosphor described above to absorb the blue light from the light source and add red fluorescent light, a light emitting device with higher color rendering properties and high quality can be realized. Particularly, in the used for the backlights of liquid crystals, a fluoride phosphor which has a narrow half width of the emission peak and a high emission intensity is preferably used. With this arrangement, a light emitting device to emit more vivid red color light can be provided.

Next, such light emitting devices which employs a fluoride phosphor as described above will be described. Examples of the light emitting devices include luminaries such as fluorescent lamp type light-emitting devices, indicating devices such as display devices and radar devices, and backlights of liquid crystal devices. The fluoride phosphors according to the present embodiment are preferably used particularly in displays. For the excitation light source of the light emitting devices, a light emitting element which can emit a light of a short-wavelength region of visible light can be used. With the light emitting devices in which the excitation light source is covered with a sealing resin which contains a phosphor, a part of light emitted from the excitation light source can be transmitted through the phosphor, and emitted to outside. Effective use of the light thus emitted to outside as a part of the desired mixed-color light can significantly reduce the loss of light emitted from the light emitting device, so that light emitting devices of high efficiency can be provided.

The light emitting devices equipped with a light emitting device include various types such as a lamp-type and a surface-mounting type. Generally, a "lamp type" indicates a type which has an exterior surface made with a lamp-shape resin member. Also, a "surface-mounting type" generally indicates a type which has a recess-shaped housing portion in which a light emitting element is mounted and in which a resin is filled. Further examples of other types of light emitting device include a type in which a light emitting element is mounted on a planar mounting substrate and a sealing resin which contains a phosphor is disposed in a lens shape to cover the light emitting element.

Figure 2:
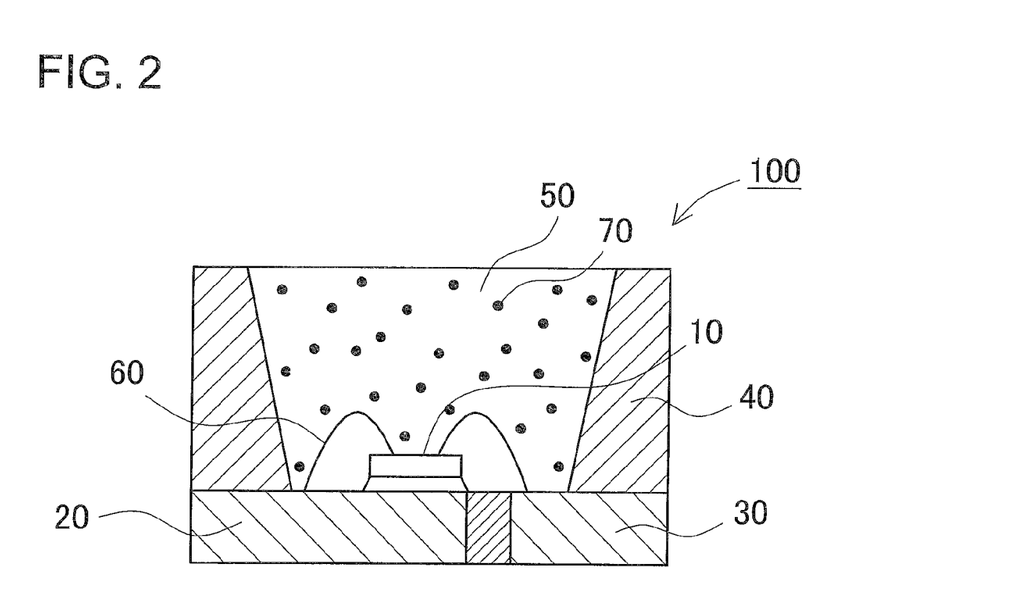
FIG. 2 is a schematic cross-sectional view of a light emitting device according to an embodiment of the present invention.
Figure 3:
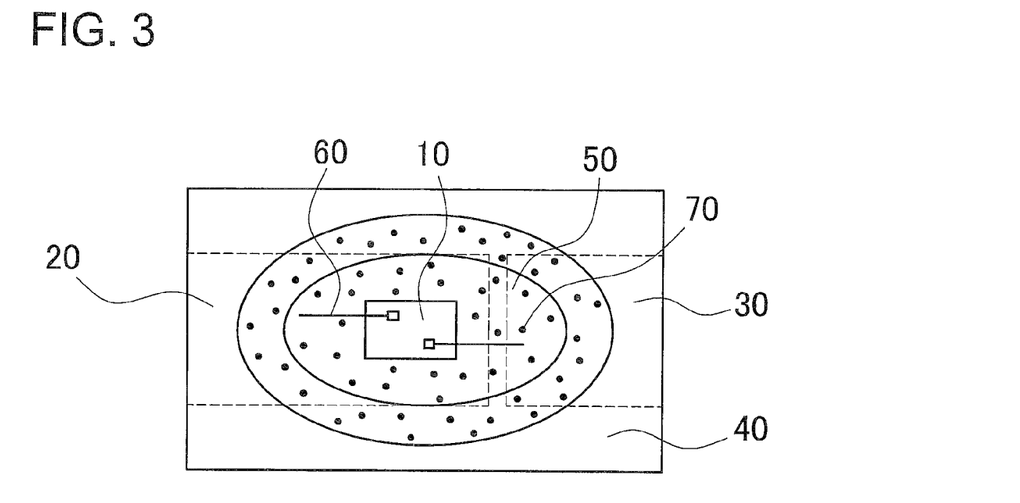
FIG. 3 is a schematic plan view showing a light emitting device according to an embodiment of the present invention.

One exemplary light emitting device which employs a fluoride phosphor will be described below. FIG. 2 is a schematic plan view of a light emitting device according to the present embodiment. FIG. 3 is a schematic plan view of a light emitting device according to the present embodiment. It should be noted that FIG. 2 shows cross section taken along line II-II in FIG. 3. The light emitting device is an example of surface-mounting type light emitting devices.

The light emitting device 100 includes a light emitting element 10 which is a gallium nitride-based compound semiconductor and can emit a short-wavelength visible light, and a molded body 40 where the light emitting element 10 is mounted. The molded body 40 includes a first lead 20 and a second lead 30 and is integrally molded with the use of a thermoplastic resin or a thermosetting resin. The molded body includes a recessed portion defined by a bottom surface and side surfaces, and a light emitting element 10 is mounted on the bottom surface of the recess. The light emitting element 10 includes a pair of electrodes which are respectively electrically connected to the first lead 20 or the second lead 30 via a wire 60. The light emitting element 10 is sealed with the sealing member 50. For the sealing member 50, a thermosetting resin such as an epoxy resin, a silicone resin, an epoxy-modified silicone resin, or a modified silicone resin is preferably employed. The sealing member 50 contains a fluoride phosphor 70 which can convert the wavelength of the light from the light emitting element 10. The main components of the light emitting device 100 will be described below.

Light Emitting Element

A light emitting element which can emit a short-wavelength visible light can be used. Particularly, a range of 420 nm to 485 nm is preferable. More preferably, a light emitting element has an emission peak wavelength in a range of 440 nm to 480 nm. With this arrangement, a fluoride phosphor can be excited efficiently which allows for effective use of the visible light. With this arrangement, a fluoride phosphor with high optical intensity can be provided. The use of such a light emitting element for the excitation light source allows for high degree of linearity between input and output, and a light emitting device which is durable to mechanical shock can be obtained. The visible light of a short wavelength region is mainly in the blue light-region.

Emission Spectrum

A fluoride phosphor absorbs a short-wavelength visible light and has an emission peak wavelength at longer wavelength side than the emission peak wavelength of the excitation light. It is preferable that the visible light of a short wavelength region is mainly in the blue light-region. More specifically, it is preferable that the phosphor is excited with a light from an excitation light source which has an emission peak wavelength between 400 nm to 500 nm, and has an emission peak wavelength in a range of 610 nm to 650 nm, with a half value width of the emission spectrum of 2 nm or greater and 10 nm or less. For the excitation light source, a light source which has an emission peak wavelength mainly between 420 nm to 485 nm, and a light source which has an emission peak wavelength between 440 nm to 480 nm is more preferably used.

Other Phosphors

The fluoride phosphors according to the present embodiment can be used singly or in combination with other phosphors. The other phosphors may absorb light from the light emitting element and convert it to light of different wavelength. Examples of other phosphors preferably include at least one selected from a nitride-based phosphor, an oxynitride-based phosphor, and a sialon-based phosphor which are activated with a lanthanoid element such as Eu and Ce, or the like, an alkaline earth halogen apatite phosphor, an alkaline earth metal borate halogen phosphor, an alkaline earth metal aluminate phosphor, an alkaline earth sulfide phosphor, an alkaline earth thiogallate phosphor, an alkaline earth silicon nitride, and a germinate which are mainly activated with a lanthanoid element such as Eu and/or a transition metal such as Mn, a rare earth aluminate and a rare earth silicate which are mainly activated with a lanthanoid element such as Ce, or an organic compound and an organic complex which are mainly activated with a lanthanoid element such as Eu. Specific examples include $(Ca,Sr,Ba)_2SiO_4$:Eu, $(Y,Gd)_3(Ga,Al)_5O_{12}$:Ce, $(Si,Al)_6(O,N)_8$:Eu(β-sialon), $SrGa_2S_4$:Eu, $(Ca,Sr)_2Si_5N_8$:Eu, $CaAlSiN_3$:Eu, and $(Ca,Sr)AlSiN_3$:Eu. Accordingly, light emitting devices with various color tones can be provided.

Example 1

Figure 4:
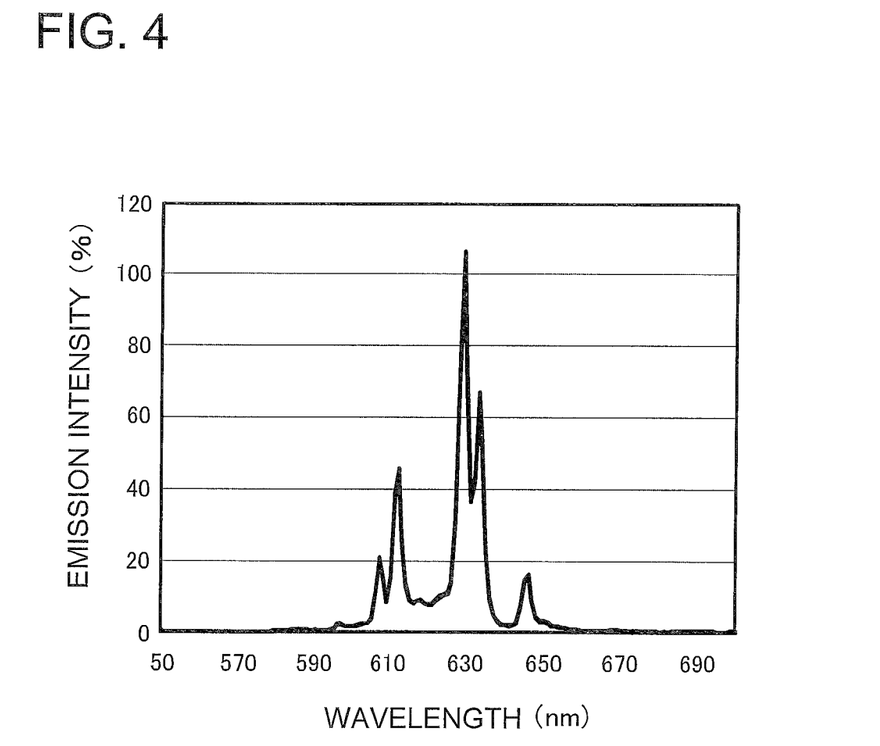
FIG. 4 is a graph showing an emission spectrum of a fluoride phosphor according to Example 6.

The fluoride phosphors according to Examples 1 to 9 and Comparison Example 1 will be described below. Table 1 shows the charging amount of the raw materials of the fluoride phosphor according to Comparison Example 1. Table 2 shows the charging amount of the raw materials of the fluoride phosphors according to Examples 1 to 9. Further, FIG. 4 shows the emission spectrum of the fluoride phosphor according to Example 6.

TABLE 1

| | Charge Composition Ratio (mol) | | | | | Solution A Charged Amount (g) 55% HF aqueous solution | | Solution B Charged Amount (g) 55% HF aqueous solution | Solution C Charged Amount (g) 40% $H_2SiF_6$ aqueous solution |
|---|---|---|---|---|---|---|---|---|---|
| | K | Si | Mn | F | $K_2MnF_6$ | | $KHF_2$ | | |
| COMPARISON EXAMPLE | 2 | 0.95 | 0.05 | 6 | 16.25 | 1000 | 195.10 | 200 | 450 |

TABLE 2

| | Charge Composition Ratio (mol) | | KSF Core (g) | Solution D Charged Amount (g) 40% $H_2SiF_6$ aqueous solution | Solution E Charged Amount (g) 55% HF aqueous solution | $KHF_2$ | 55% HF aqueous solution | Fluorescent Material Core (g) COMPARISON EXAMPLE Fluorescent Material | Reducing Agent (g) 30% $H_2O_2$ aqueous solution |
|---|---|---|---|---|---|---|---|---|---|
| | K | Si | | | | | | | |
| EXAMPLE 1 | 0.25 | 0.25 | 1 | 12.27 | 150 | 2.66 | 60 | 30.0 | 1.5 |
| EXAMPLE 2 | 0.25 | 0.25 | 1 | 24.53 | 150 | 2.66 | 60 | 30.0 | 1.5 |
| EXAMPLE 3 | 0.25 | 0.25 | 1 | 36.81 | 150 | 2.66 | 60 | 30.0 | 1.5 |
| EXAMPLE 4 | 0.50 | 0.50 | 1 | 12.27 | 150 | 5.32 | 60 | 30.0 | 1.5 |

TABLE 2-continued

| | Charge Composition Ratio (mol) | | | Solution D Charged Amount (g) | | Solution E Charged Amount (g) | | Fluorescent Material Core (g) | Reducing Agent (g) |
|---|---|---|---|---|---|---|---|---|---|
| | K | Si | KSF Core (g) | 40% $H_2SiF_6$ aqueous solution | 55% HF aqueous solution | $KHF_2$ | 55% HF aqueous solution | COMPARISON EXAMPLE Fluorescent Material | 30% $H_2O_2$ aqueous solution |
| EXAMPLE 5 | 0.50 | 0.50 | 1 | 24.53 | 150 | 5.32 | 60 | 30.0 | 1.5 |
| EXAMPLE 6 | 0.50 | 0.50 | 1 | 36.81 | 150 | 5.32 | 60 | 30.0 | 1.5 |
| EXAMPLE 7 | 1.00 | 0.75 | 1 | 12.27 | 150 | 10.64 | 60 | 30.0 | 1.5 |
| EXAMPLE 8 | 1.00 | 0.75 | 1 | 24.53 | 150 | 10.64 | 60 | 30.0 | 1.5 |
| EXAMPLE 9 | 1.00 | 0.75 | 1 | 36.81 | 150 | 10.64 | 60 | 30.0 | 1.5 |

Comparison Example 1

First, a method of manufacturing a fluoride phosphor according to Comparison Example 1 which serves as a phosphor core will be described. In order to obtain the charge composition ratio shown in Table 1, 16.25 g of $K_2MnF_6$ was weighed and dissolved in 1000 g of 55 wt % HF aqueous solution to prepare the solution A. Meanwhile, the solution B was prepared by weighing 195.10 g of $KHF_2$ and dissolving it in 200 g of 55 wt % HF aqueous solution. Also, 450 g of 40 wt % $H_2SiF_6$ aqueous solution was weighed to prepare the solution C. Then, while stirring the solution A, the solution B and the solution C were added simultaneously. The precipitated product was isolated and washed with IPA and dried at 70° C. for 10 hours. Thus, the fluoride phosphor according to Comparison Example 1 which serves as a phosphor core was prepared.

Example 1

Next, processes of manufacturing the fluoride phosphors according to Example 1 will be described below. In order to obtain the charge composition ratio shown in Table 2, 12.27 g of 40 wt % $H_2SiF_6$ aqueous solution was weighed and 150 g of 55 wt % HF aqueous solution was added to prepare the solution D. Meanwhile, the solution E was prepared by weighing 2.66 g of $KHF_2$ and dissolving it in 60 g of 55 wt % HF aqueous solution. Next, while stirring the solution D, 30.0 g of the phosphor core obtained in Comparison Example 1 was charged in the solution D, then 1.5 g of 30 wt % $H_2O_2$ aqueous solution was added to reduce the eluted $Mn^{4+}$ into $Mn^{2+}$ to suppress the generation of fluoride complex $[MnF_6]^{2-}$. In the present example, hydrogen peroxide ($H_2O_2$) is employed as the reducing agent, but in a method of manufacturing a phosphor according to the present example, the reducing agent is not limited to hydrogen peroxide and other reducing agents such as oxalic acid can also be employed.

$$[MnF_6]^{2-}+2H_2O_2 \rightarrow Mn^{2+}+4HF+2O_2\uparrow$$

The $[MnF_6]^{2-}$ in the solution D was changed to $Mn^{2+}$ by the reaction, then the solution E was added to create the surface region on the phosphor particles of Comparison Example 1 so that the concentration of tetravalent Mn is lower than that of the inner region of the phosphor particles. The precipitation thus obtained is isolated and washed with IPA, then dried at 70° C. for 10 hours to form the fluoride phosphor according to Example 1.

Examples 2 to 9

The fluoride phosphors according to Examples 2 to 9 were formed in a similar manner as in Example 1, except for changing the charging composition ratio and the charged amounts which are shown in Table 2. The emission luminance characteristics of the respective fluoride phosphors obtained in this manner and the emission luminance characteristics after evaluating the water resistance are shown in Table 3.

TABLE 3

| | Chromaticity Coordinates | | Relative Luminance | Chromaticity Coordinates | | Relative Luminance | Luminous Flux Maintaining Rate |
|---|---|---|---|---|---|---|---|
| | x | y | (%) | x | y | (%) | (%) |
| COMPARISON EXAMPLE 1 | 0.677 | 0.313 | 100.0 | 0.678 | 0.312 | 60.4 | 60.4 |
| EXAMPLE 1 | 0.677 | 0.312 | 100.0 | 0.677 | 0.312 | 96.1 | 96.1 |
| EXAMPLE 2 | 0.677 | 0.312 | 100.0 | 0.677 | 0.312 | 96.9 | 96.3 |
| EXAMPLE 3 | 0.677 | 0.312 | 99.7 | 0.678 | 0.312 | 94.5 | 94.7 |
| EXAMPLE 4 | 0.677 | 0.312 | 97.4 | 0.677 | 0.312 | 97.4 | 100.0 |
| EXAMPLE 5 | 0.677 | 0.312 | 97.1 | 0.678 | 0.312 | 96.3 | 99.2 |
| EXAMPLE 6 | 0.677 | 0.313 | 94.5 | 0.677 | 0.312 | 96.3 | 101.9 |
| EXAMPLE 7 | 0.677 | 0.313 | 93.7 | 0.677 | 0.312 | 95.3 | 101.7 |
| EXAMPLE 8 | 0.677 | 0.312 | 92.7 | 0.677 | 0.312 | 92.4 | 99.7 |
| EXAMPLE 9 | 0.677 | 0.312 | 91.3 | 0.677 | 0.312 | 90.8 | 99.4 |

Emission Luminance Measurement Result

Prior to evaluating the water resistance, a standard testing for the emission luminance was conducted on the fluoride phosphors obtained according to Examples 1 to 9 and Comparison Example 1. The relative emission luminances of the fluoride phosphors compared to the emission luminance of the fluoride phosphor of Comparison Example as 100% were respectively shown in Table 3. As clearly shown in the table, the relative emission luminances are slightly decreased except for that of the fluoride phosphors of Examples 1 and 2. This is considered that formation of the surface region on the phosphor particles impedes a part of the components of light to be emitted to outside.

Water Resistance Evaluation Result

The fluoride phosphors according to Examples 1 to 9 and Comparison Example 1 will be described below. The water resistance evaluation was conducted in such a manner that a 5 g of a phosphor was stirred in a 15 g of pure water for 1 hour, then isolated, washed with IPA, and dried at 70° C., for 10 hours, then, the emission luminances were compared to the emission luminances before evaluation of the water resistance. The results of the water resistance evaluation are shown in Table 3. As clearly shown in the table, while the emission luminance dropped to 60. 4% in the fluoride phosphor of Comparison Example 1 which does not have the surface region described above, all the fluoride phosphors of Examples maintain the 94% or greater luminous fluxes. Thus, validity of the present example was confirmed. Particularly, the fluoride phosphors of Examples 4 to 9 respectively show higher emission luminance than that prior to the water resistance evaluation test. This is considered that a part of the output light was initially impeded by the surface region formed on the phosphor particles, but elusion of the surface region due to the water resistance evaluation test allows for a reduction in such impeding which increases the luinance components. That is, according to the present example, not only reducing the deterioration of the emission luminance over time but also maintaining and improving of the emission luminance are also confirmed.

Region/Inner Region" according to Example 1 to 9 were calculated by dividing "Calculated Value (mole ratio) of Phosphor Surface Composition" by "Phosphor Composition Analysis Values (mole ratio)" of the phosphor core according to Comparison Example 1. This is because "Mn Concentration of Inner Region" of the phosphor according to each example is assumed to be substantially the same as the Mn concentration in the phosphor core according to Comparison Example 1. The results combined with the composition analysis results of the entire portion of the phosphor particle with the use of ICP are shown in Table 4. As clearly shown from those results, the eluded amount of 11 ppm of Mn is apparently large in Comparison Example 1. To the contrary, the eluded amount of Mn is suppressed to 0.5 to 2.2 ppm in each example. Thus, a low amount of eluded Mn, in other words, a low production amount of manganese dioxide is proved, confirming that occurrence of darkening is suppressed, which allows for less degree of degradation with time in luminance.

The fluoride phosphors according to the embodiments of the invention can be suitably used for display devices, light source of luminaries, signaling devices, switches with lighting, various sensors, various indicators, and so forth, and particularly suitably used for backlight of liquid crystal devices.

A fluoride phosphor according to an aspect of the disclosure is a fluoride phosphor activated with tetravalent Mn which can absorb blue light and emit red light. The fluoride phosphor is represented by the general formula shown below, and the particles of the phosphor respectively have a surface region where the concentration of tetravalent Mn is lower than the inner region.

$K_2[M_{1-a}Mn^{4+}{}_aF_6]$ (where M is at least one selected from group-IV elements of Ti, Zr, and Hf and group IVB elements of Si, Ge, Sn, and a is 0<a<0.2).

Further, according to another aspect of the embodiment of the invention, a method of manufacturing a fluoride phosphor which is a fluoride phosphor activated with tetravalent Mn to absorb blue light and emit red light, having a general formula $K_2[M_{1-a}Mn^{4+}{}_aF_6]$ (where M is at least one selected from group-IV elements of Ti, Zr, and Hf and group IVB elements of Si, Ge, Sn, and a is 0<a<0.2); the method may include forming phosphor cores, including mixing a solution which contains at least Mn and F, a solution which contains at least K and F, and a solution which contains at least Si and F, which

TABLE 4

| | Fluorescent Material Composition Analysis Value (mol ratio) | | Eluted Amount in Pure Water (ppm) | | Calculated Surface Composition of Fluorescent Material (mol ratio) | | Surface Region/Inner Region Mn |
|---|---|---|---|---|---|---|---|
| | K | Mn | K | Mn | K | Mn | Concentration (%) |
| COMPARISON EXAMPLE | 2.000 | 0.031 | 440 | 11.0 | 2.000 | 0.036 | 115 |
| EXAMPLE 1 | 2.000 | 0.030 | 440 | 2.2 | 2.000 | 0.007 | 23 |
| EXAMPLE 2 | 2.000 | 0.030 | 420 | 1.3 | 2.000 | 0.004 | 14 |
| EXAMPLE 3 | 2.000 | 0.029 | 410 | 1.1 | 2.000 | 0.004 | 12 |
| EXAMPLE 4 | 2.000 | 0.027 | 410 | 0.8 | 2.000 | 0.003 | 9 |
| EXAMPLE 5 | 2.000 | 0.026 | 430 | 0.7 | 2.000 | 0.002 | 8 |
| EXAMPLE 6 | 2.000 | 0.026 | 440 | 0.7 | 2.000 | 0.002 | 7 |
| EXAMPLE 7 | 2.000 | 0.023 | 420 | 1.3 | 2.000 | 0.004 | 14 |
| EXAMPLE 8 | 2.000 | 0.022 | 430 | 0.6 | 2.000 | 0.002 | 6 |
| EXAMPLE 9 | 2.000 | 0.022 | 450 | 0.5 | 2.000 | 0.002 | 5 |

Surface Composition Analysis

Last, the fluoride phosphors respectively obtained according to Examples 1 to 9, and Comparison Example 1 were charged in pure water to elude the surfaces of the phosphor particles. Then, composition analysis is conducted and based on the composition analysis, the surface compositions of the fluoride phosphors were calculated. The evaluation on the composition of elution was conducted in such a manner that, 5 g of the phosphors were stirred for one hour in pure water which contains 0.5% hydrogen peroxide, then the respective supernatant were taken for composition analysis by using ICP. The ratio of concentration of Mn in the surface regions of the fluoride phosphors according to Examples 1 to 9 were calculated with the use of the analysis values of the fluoride phosphor according to Comparison Example 1 as the inner compositions. That is, "Mn Concentration Ratio of Surface are to be described below; and forming a surface region on each phosphor core, including mixing the phosphor cores and a solution containing a reducing agent to form a surface region on the phosphor cores to form phosphor particles so that a concentration of tetravalent Mn on the surface region is lower than in the inner region of each phosphor particle.

According to the embodiments, a red light-emitting phosphor can be obtained in which good light emission characteristics and excellent water resistance are realized. Also, a red light-emitting phosphor can be utilized with narrower half width of the emission peak.

The method of manufacturing a phosphor according to the embodiments can provide a red light-emitting phosphor with a narrow half width of the emission peak, in which good light emission characteristics and excellent water resistance are realized.

It is to be understood that although embodiments of the present invention has been described, various other embodiments and variants may occur to those skilled in the art, which are within the scope and spirit of the invention, and such other embodiments and variants are intended to be covered by the following claims.

What is claimed is:

1. A method of manufacturing a fluoride phosphor, comprising:
    mixing a first solution which contains at least Mn and F, a second solution which contains at least K and F, and a third solution which contains at least Si and F to form phosphor cores whose composition is represented by a formula $K_2[M_{1-a}Mn^{4+}{}_aF_6]$ wherein a satisfies $0<a<0.2$, and M comprises at least one selected from group-IV elements of Ti, Zr, and Hf and group IVB elements of Si, Ge, Sn; and
    mixing the phosphor cores and a fourth solution containing a reducing agent to form a surface region on each of the phosphor cores so that a concentration of tetravalent Mn on the surface region of one of the phosphor cores is lower than in an inner region of the one of the phosphor cores.

2. The method according to claim 1,
wherein the reducing agent comprises hydrogen peroxide.

3. The method according to claim 1,
wherein the surface region is formed by mixing the phosphor cores, a fifth solution which contains at least Si and F, a sixth solution which contains at least K and F, and a seventh solution which contains a reducing agent.

4. The method according to claim 3,
wherein the surface region is formed by charging the phosphor cores in an eighth solution which contains at least Si and F, and adding a ninth solution which contains a reducing agent and a tenth solution which contains at least K and F to the eighth solution including the phosphor cores.

5. A method of manufacturing a fluoride phosphor, comprising:
    mixing a first solution which contains at least Mn and F, a second solution which contains at least K and F, and a third solution which contains at least Si and F to form phosphor cores whose composition is represented by a formula $K_2[M_{1-a}Mn^{4+}{}_aF_6]$ wherein a satisfies $0<a<0.2$, and M comprises at least one selected from group-IV elements of Ti, Zr, and Hf and group IVB elements of Si, Ge, Sn;
    introducing the phosphor cores into the third solution; and
    mixing the third solution including the phosphor cores, a fourth solution containing a reducing agent, and the second solution which does not substantially contain tetravalent Mn to form a surface region on each of the phosphor cores such that a concentration of tetravalent Mn in the surface region of one of the phosphor cores is 0.5% or more and 30% or less with respect to a concentration of tetravalent Mn in an inner region of the one of the phosphor cores.

6. The method according to claim 5,
wherein the reducing agent comprises hydrogen peroxide or oxalic acid.

7. The method according to claim 5,
wherein a concentration of tetravalent Mn is approximately uniform in the inner region of the one of the phosphor cores, and is gradually decreased toward a surface in the surface region of the one of the phosphor cores.

8. The method according to claim 5,
wherein M comprises Si or Si and Ge.

9. The method according to claim 5,
wherein the concentration of tetravalent Mn in the surface region of the one of the phosphor cores is 0.5% or more and 25% or less with respect to the concentration of tetravalent Mn in the inner region of the one of the phosphor cores.

10. The method according to claim 5,
wherein the concentration of tetravalent Mn in the surface region of the one of the phosphor cores is 0.5% or more and 20% or less with respect to the concentration of tetravalent Mn in the inner region of the one of the phosphor cores.

11. A method of manufacturing a fluoride phosphor, comprising:
    mixing a first solution which contains at least Mn and F, a second solution which contains at least K and F, and a third solution which contains at least Si and F to form phosphor cores whose composition is represented by a formula $K_2[M_{1-a}Mn^{4+}{}_aF_6]$ wherein a satisfies $0<a<0.2$, and M comprises at least one selected from group-IV elements of Ti, Zr, and Hf and group IVB elements of Si, Ge, Sn; and
    mixing the phosphor cores and a fourth solution containing a reducing agent.

12. The method according to claim 11, further comprising:
introducing the phosphor cores into the third solution.

13. The method according to claim 11, further comprising:
introducing the phosphor cores into the third solution; and
mixing the third solution including the phosphor cores and the fourth solution.

14. The method according to claim 11, further comprising:
introducing the phosphor cores into the third solution; and
mixing the third solution including the phosphor cores, the fourth solution, and the second solution.

15. The method according to claim 14,
wherein the second solution does not substantially contain tetravalent Mn.

* * * * *